United States Patent
Yuen

(10) Patent No.: US 12,119,610 B2
(45) Date of Patent: Oct. 15, 2024

(54) TOP-EMITTING VERTICAL-CAVITY SURFACE-EMITTING LASER WITH BOTTOM-EMITTING STRUCTURE

(71) Applicant: Lumentum Operations LLC, San Jose, CA (US)

(72) Inventor: Albert Yuen, Palo Alto, CA (US)

(73) Assignee: Lumentum Operations LLC, San Jose, CA (US)

( * ) Notice: Subject to any disclaimer, the term of this patent is extended or adjusted under 35 U.S.C. 154(b) by 0 days.

(21) Appl. No.: 18/151,505

(22) Filed: Jan. 9, 2023

(65) Prior Publication Data
US 2023/0163557 A1 May 25, 2023

Related U.S. Application Data

(63) Continuation of application No. 16/884,532, filed on May 27, 2020, now Pat. No. 11,552,445.

(60) Provisional application No. 62/951,822, filed on Dec. 20, 2019.

(51) Int. Cl.
| | |
|---|---|
| *H01S 5/02255* | (2021.01) |
| *H01S 5/02* | (2006.01) |
| *H01S 5/02253* | (2021.01) |
| *H01S 5/02257* | (2021.01) |
| *H01S 5/183* | (2006.01) |
| *H01S 5/42* | (2006.01) |

(52) U.S. Cl.
CPC ........ *H01S 5/02255* (2021.01); *H01S 5/0207* (2013.01); *H01S 5/02253* (2021.01); *H01S 5/02257* (2021.01); *H01S 5/18305* (2013.01); *H01S 5/18361* (2013.01); *H01S 5/423* (2013.01)

(58) Field of Classification Search
CPC ............... H01S 5/02255; H01S 5/0207; H01S 5/02253; H01S 5/02257; H01S 5/18305; H01S 5/18361; H01S 5/423
See application file for complete search history.

(56) References Cited

U.S. PATENT DOCUMENTS

| | | | |
|---|---|---|---|
| 5,400,419 A | 3/1995 | Heinen | |
| 6,274,891 B1 * | 8/2001 | Tanaka | ................ H01S 5/32325 257/67 |
| 6,611,544 B1 | 8/2003 | Jiang et al. | |
| 11,552,445 B2 | 1/2023 | Yuen | |
| 2001/0021214 A1 * | 9/2001 | Jiang | ...................... H01S 5/041 372/50.1 |
| 2003/0199109 A1 * | 10/2003 | Kuzma | ................... H01L 22/34 438/16 |
| 2009/0097519 A1 * | 4/2009 | Brick | ...................... H01S 5/185 372/44.01 |
| 2010/0316076 A1 | 12/2010 | Behfar et al. | |

(Continued)

*Primary Examiner* — Yuanda Zhang
(74) *Attorney, Agent, or Firm* — Harrity & Harrity, LLP

(57) ABSTRACT

A vertical cavity surface emitting laser (VCSEL) may include a substrate layer, epitaxial layers on the substrate layer, and angled reflectors configured to receive an optical beam emitted toward a bottom surface of the VCSEL and redirect the optical beam through an exit window in a top surface of the VCSEL. In some implementations, the angled reflectors may be formed in the substrate layer. Additionally, or alternatively, the VCSEL may include molded optics, where the molded optics include the angled reflectors. In some implementations, the exit window may include an integrated lens.

20 Claims, 6 Drawing Sheets

(56) References Cited

U.S. PATENT DOCUMENTS

2013/0223789 A1 8/2013 Lee et al.
2018/0301871 A1 10/2018 Dummer et al.

\* cited by examiner

TOP-EMITTING VERTICAL-CAVITY SURFACE-EMITTING LASER WITH BOTTOM-EMITTING STRUCTURE

RELATED APPLICATION

This application is a continuation of U.S. patent application Ser. No. 16/884,532, filed on May 27, 2020, which claims priority to U.S. Provisional Patent Application No. 62/951,822, filed on Dec. 20, 2019, the contents of which are incorporated herein by reference in their entireties.

TECHNICAL FIELD

The present disclosure relates generally to vertical-cavity surface-emitting lasers (VCSELs) and to top-emitting VCSELs with bottom-emitting structures.

BACKGROUND

A vertical-emitting device, such as a vertical cavity surface emitting laser (VCSEL), is a laser in which a beam is emitted in a direction perpendicular to a surface of a substrate (e.g., vertically from a surface of a semiconductor wafer). Multiple vertical-emitting devices may be arranged in an array with a common substrate.

SUMMARY

According to some implementations, a vertical cavity surface emitting laser may include a substrate layer, epitaxial layers on the substrate layer, and angled reflectors configured to receive an optical beam emitted toward a bottom surface of the VCSEL and redirect the optical beam through an exit window in a top surface of the VCSEL.

According to some implementations, an optical device may include a chip having a top surface and a bottom surface and an array, on the chip, of VCSEL devices, wherein each VCSEL device, of the array of VCSEL devices, includes an emitting region configured to emit an optical beam toward the bottom surface, an exit window in the top surface, and angled reflectors configured to receive the optical beam from the emitting region and redirect the optical beam through the exit window.

According to some implementations, a method may include forming, on a substrate layer, epitaxial layers to form a VCSEL to emit an optical beam through the substrate layer and providing angled reflectors configured to receive the optical beam and redirect the optical beam through an exit window in a top surface of the VCSEL.

DETAILED DESCRIPTION

The following detailed description of example implementations refers to the accompanying drawings. The same reference numbers in different drawings may identify the same or similar elements.

VCSELs may have a top-emitting structure (e.g., a top-emitting design) or a bottom-emitting structure (e.g., a bottom-emitting design). Top-emitting structures may be easier to fabricate, test, package, and/or the like than bottom-emitting structures. For example, a top-emitting structure may be tested, using a conventional wafer-level test station, more easily than a bottom-emitting structure. Bottom-emitting structures may have improved thermal conductivity and/or a greater quantity of options for integrated lensing than top-emitting structures. For example, in a bottom-emitting structure, an entire optical aperture may be electrically pumped with thermal heatsinking through top plated metallization.

Some implementations described herein provide a top-emitting VCSEL having a bottom-emitting structure. In some implementations, a VCSEL may include a substrate layer, epitaxial layers on the substrate layer, and angled reflectors configured to receive an optical beam emitted toward a bottom surface of the VCSEL and redirect the optical beam through an exit window in a top surface of the VCSEL. In some implementations, the angled reflectors are formed in the substrate layer. For example, the angled reflectors may include a first angled trench and a second angled trench, where the first angled trench redirects the optical beam toward the second angled trench, which redirects the optical beam to the exit window.

Additionally, or alternatively, the VCSEL may include molded optics (e.g., attached to a bottom surface of the substrate layer and/or the like), where the molded optics include the angled reflectors. For example, the molded optics may include the angled reflectors for redirecting the optical beam and one or more optical elements to modify the optical beam (e.g., as the optical beam passes through the molded optics).

In this way, the VCSEL may provide the benefits of a bottom-emitting structure (e.g., improved thermal conductivity and/or the like) as well as the benefits of a top-emitting structure (e.g., easier fabrication, testing, packaging, and/or the like). In some implementations, the VCSEL may provide benefits (e.g., uniformity of temperature and electron carriers) of a fully electrically pumped oxide aperture as in a bottom-emitting structure with an ease of packaging associated with a top-emitting VCSEL. Additionally, or alternatively, the VCSEL may provide wafer-level integration, a lower cost, a smaller footprint, a smaller size, and/or easier packaging in a final module as compared to a conventional free space package with an emitter, angled reflector(s), and a lensed cover.

Figure 1:
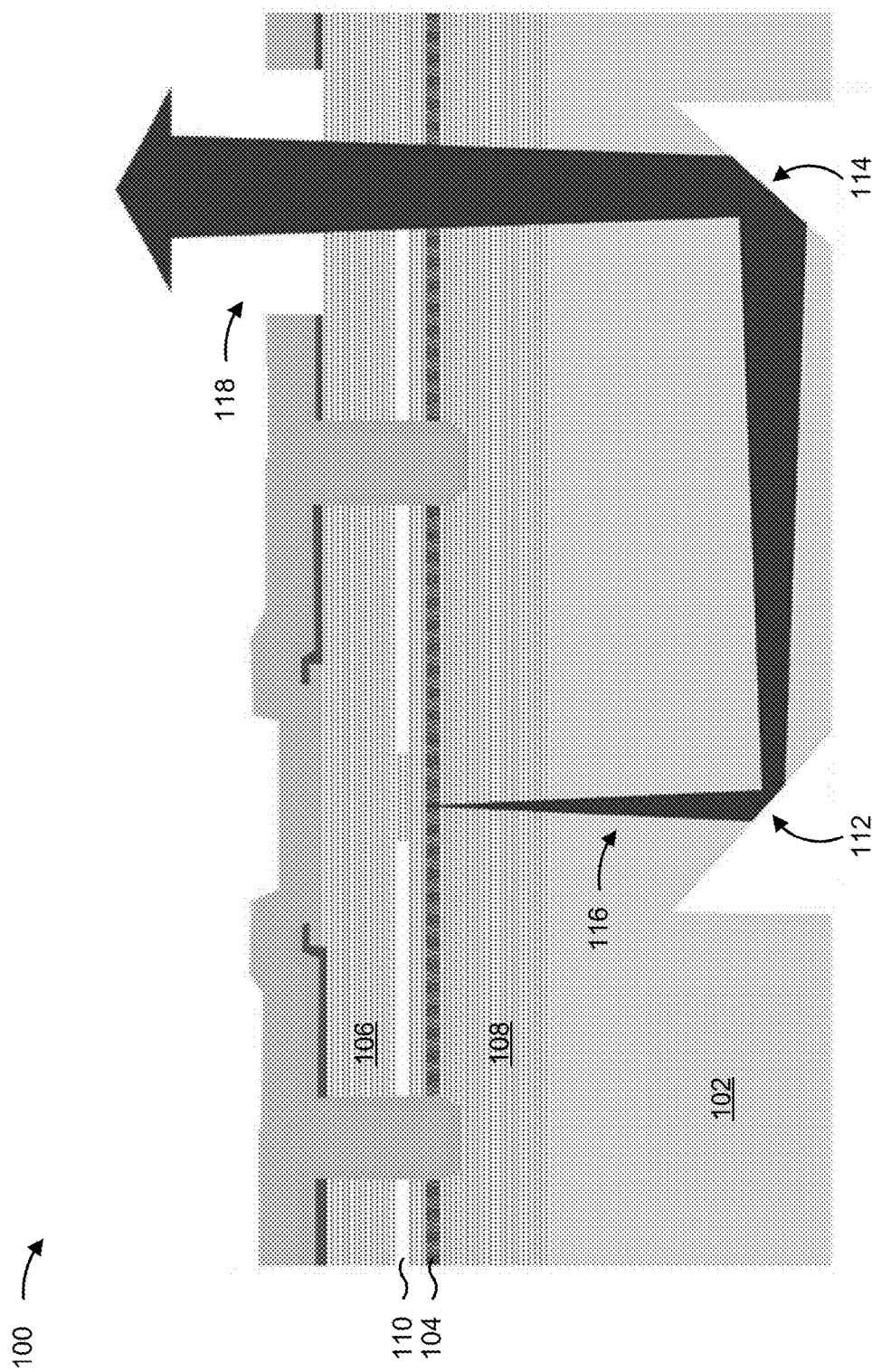
FIGS. 1-4 are diagrams of side views of cross-sections of example implementations of a VCSEL described herein.

FIG. 1 is a diagram of a side view of a cross-section of an example implementation 100 of a VCSEL described herein. As shown in FIG. 1, the VCSEL may include a substrate layer 102, an active layer 104, a first mirror 106, a second mirror 108, an oxidation layer 110, a first angled reflector 112, a second angled reflector 114, and an exit window 118. In some implementations, the active layer 104, the first mirror 106, the second mirror 108, and/or the oxidation layer 110 may be epitaxial layers (e.g., grown on substrate layer 102).

In some implementations, the substrate layer 102 may include a base substrate layer upon which epitaxial layers (e.g., the active layer 104, the first mirror 106, the second mirror 108, the oxidation layer 110, and/or the like) are grown. For example, the substrate layer 102 may include a semiconductor layer, such as an n-type gallium arsenide (n-GaAs) layer, an indium phosphide (InP) layer, and/or the like.

In some implementations, the active layer 104 may include a layer that confines electrons and defines an emission wavelength of the VCSEL. For example, the active layer 104 may be a quantum well. In some implementations, and as shown in FIG. 1, the active layer 104 may be between the first mirror 106 and the second mirror 108.

In some implementations, the first mirror 106 may include a top reflector layer. For example, the first mirror 106 may include a p-type distributed Bragg reflector (DBR).

In some implementations, the second mirror 108 may include a bottom reflector layer. For example, the second mirror 108 may include an n-type DBR.

In some implementations, the oxidation layer 110 may include an oxide layer that provides optical and electrical confinement. In some implementations, the oxidation layer 110 may be formed as a result of wet oxidation of an epitaxial layer. Additionally, or alternatively, the oxidation layer 110 may form a current confinement aperture (e.g., an optically active aperture, an optical aperture, an oxide aperture, and/or the like). In some implementations, and as shown in FIG. 1, the oxidation layer 110 may be proximate to the active layer 104.

As shown in FIG. 1, the VCSEL may emit, from the active layer 104, an optical beam 116 (e.g., an output beam, a laser beam, and/or the like) toward a bottom surface of the VCSEL (e.g., through the second mirror 108, the substrate layer 102, and/or the like). As also shown in FIG. 1, the first angled reflector 112 may redirect the optical beam 116 toward the second angled reflector 114, and the second angled reflector 114 may redirect the optical beam 116 to the exit window 118. For example, the first angled reflector 112 may redirect the optical beam 116 at 90 degrees toward the second angled reflector 114, and the second angled reflector 114 may redirect the optical beam 116 at 90 degrees to the exit window 118. In this way, the first angled reflector 112 and the second angled reflector 114 may receive the optical beam 116 and redirect the optical beam 116 through the exit window 118 (e.g., in a top surface of the VCSEL).

In some implementations, the first angled reflector 112 and/or the second angled reflector 114 may modify the optical beam 116. For example, the first angled reflector 112 and/or the second angled reflector 114 may collimate, focus, expand, contract, and/or the like the optical beam 116.

In some implementations, the first angled reflector 112 and/or the second angled reflector 114 may provide a step in an index of refraction (e.g., a substrate-air interface and/or the like) to redirect the optical beam. Additionally, or alternatively, the first angled reflector 112 and/or the second angled reflector 114 may include a metal, a dielectric, and/or the like. For example, the first angled reflector 112 and/or the second angled reflector 114 may include a gold coating, a SiNx/SiOx/SiNx coating, and/or the like. In some implementations, the first angled reflector 112 and/or the second angled reflector 114 may redirect the optical beam 116 using total internal reflection.

In some implementations, the first angled reflector 112 and/or the second angled reflector 114 may be formed in the substrate layer 102. For example, the first angled reflector 112 and/or the second angled reflector 114 may be angled trenches (e.g., 45-degree angled etched trenches) etched into the substrate layer 102.

In some implementations, the first angled reflector 112 and/or the second angled reflector 114 may be created during device fabrication on a substrate side of a wafer (e.g., including one or more VCSELs). For example, the wafer may be placed at an angle (e.g., 45 degrees) in a process chamber during fabrication. Additionally, or alternatively, the first angled reflector 112 and/or the second angled reflector 114 may be created using a reactive ion etch (RIE) technique, an ion beam etching (IBE) technique, an argon sputtering technique, and/or the like. In some implementations, the first angled reflector 112 and/or the second angled reflector 114 may be created using multiple lithography and/or etch steps to form multiple angled trenches in different orientations with respect to the optical beam 116.

As shown in FIG. 1, the optical beam 116 may expand as it travels through the VCSEL (e.g., the substrate layer 102). In some implementations, the first angled reflector 112 and/or the second angled reflector 114 may have a size to prevent loss of portions of the optical beam 116 as the optical beam 116 expands while traveling through the VCSEL. Additionally, or alternatively, the first angled reflector 112 and/or the second angled reflector 114 may be configured to have an angle to prevent loss of portions of the optical beam 116 as the optical beam 116 expands while traveling through the VCSEL.

By having a bottom-emitting structure, the VCSEL may fully electrically pump an optical aperture formed by the oxidation layer 110 with thermal heatsinking through top-plated metallization. By emitting the optical beam 116 through a top surface of the VCSEL, the VCSEL may be easily tested, packaged, and/or the like.

As indicated above, FIG. 1 is provided as an example. Other examples may differ from what is described with regard to FIG. 1. For example, the number and arrangement of layers shown in FIG. 1 are provided as an example. In practice, the VCSEL may include additional layers, fewer layers, different layers, or differently arranged layers than those shown in FIG. 1.

Figure 2:
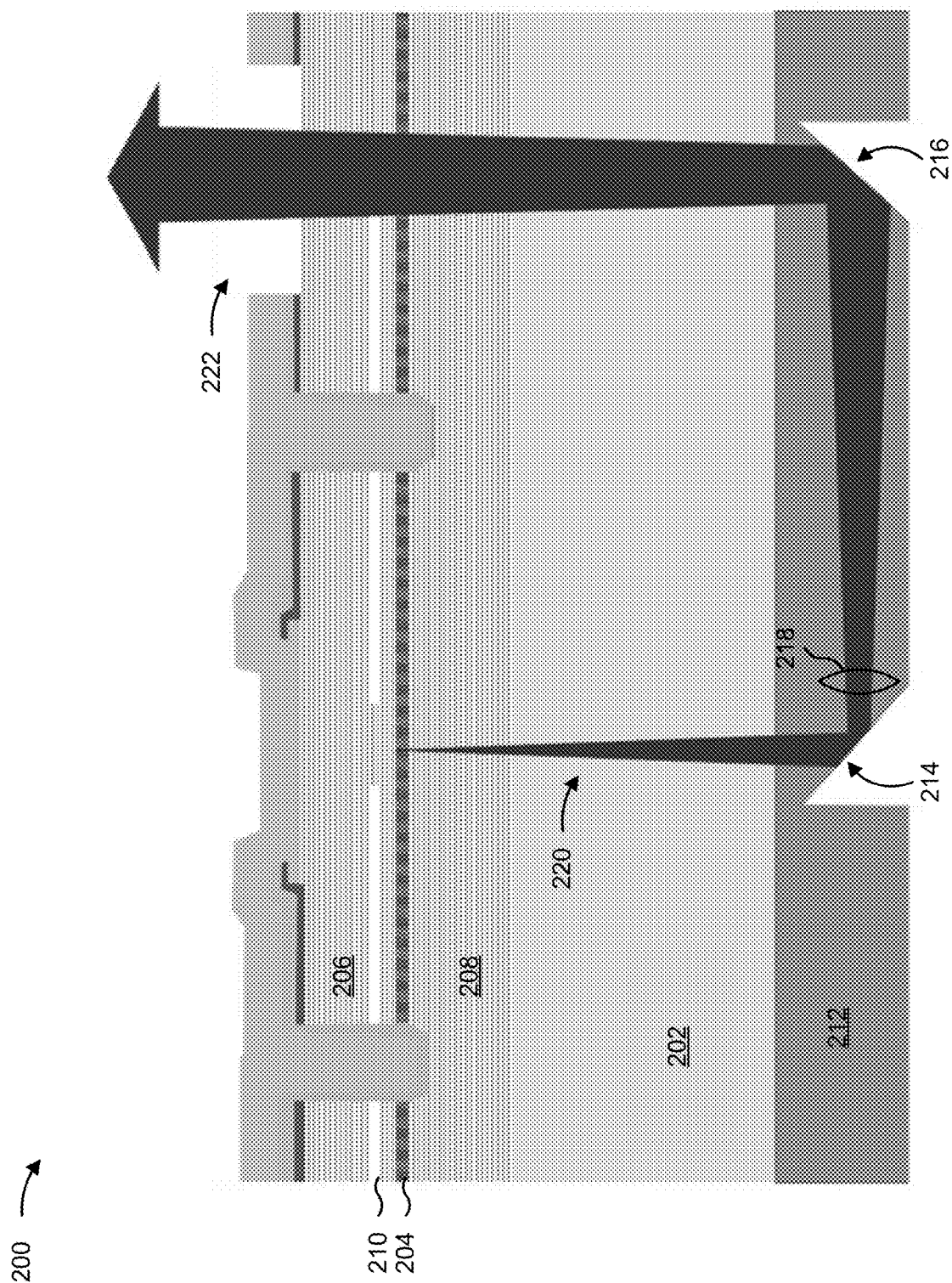

FIG. 2 is a diagram of a side view of a cross-section of an example implementation 200 of a VCSEL described herein. As shown in FIG. 2, the VCSEL may include a substrate layer 202, an active layer 204, a first mirror 206, a second mirror 208, an oxidation layer 210, molded optics 212, a first angled reflector 214, a second angled reflector 216, an optical element 218, and an exit window 222.

In some implementations, the substrate layer 202, the active layer 204, the first mirror 206, the second mirror 208, the oxidation layer 210, and/or the exit window 222 may be respectively similar to the substrate layer 102, the active layer 104, the first mirror 106, the second mirror 108, the oxidation layer 110, and/or the exit window 118 shown in and described herein with respect to FIG. 1. For example, the active layer 204, the first mirror 206, the second mirror 208, and/or the oxidation layer 210 may be epitaxial layers (e.g., grown on substrate layer 202).

As shown in FIG. 2, the molded optics 212 may be positioned on and/or attached to (e.g., via epoxy and/or the like) a bottom surface of the substrate layer 202, and may include the first angled reflector 214, the second angled reflector 216, and/or the optical element 218. In some implementations, the molded optics 212 may be formed from an optically transparent material, such as poly(methyl methacrylate) (PMMA) (e.g., acrylic, acrylic glass, and/or the like), polyetherimide (PEI) (e.g., ULTEM and/or the like), fused silica, sapphire, and/or the like. In some implementations, the molded optics 212 may be formed from a material having a thermal expansion coefficient similar to a thermal expansion coefficient of the substrate layer 202.

In some implementations, other than being formed in the molded optics 212 rather than the substrate layer 202, the first angled reflector 214 and the second angled reflector 216 may be respectively similar to the first angled reflector 112 and the second angled reflector 114 as shown in and described herein with respect to FIG. 1. For example, and as shown in FIG. 2, the first angled reflector 214 may redirect the optical beam 220 toward the second angled reflector 216, and the second angled reflector 216 may redirect the optical beam 220 to the exit window 222.

In some implementations, the optical element 218 may modify the optical beam 220. For example, the optical element 218 may collimate, focus, expand, contract, and/or the like the optical beam 220. In some implementations, the molded optics 212 may include a plurality of optical elements, similar to the optical element 218, positioned in a path of the optical beam 220.

In some implementations, providing the first angled reflector 214 and/or the second angled reflector 216 in the form of the molded optics 212 may simplify fabrication of a top-emitting VCSEL with a bottom-emitting structure (e.g., as compared to etching angled reflectors into a substrate layer). For example, the VCSEL may be manufactured using a conventional fabrication process for a bottom-emitting structure, and the molded optics 212 may be attached to a bottom surface of the substrate layer 202. Additionally, or alternatively, the molded optics 212 may include a plurality of optical elements, as described above, to modify the optical beam 220.

As indicated above, FIG. 2 is provided as an example. Other examples may differ from what is described with regard to FIG. 2. For example, the number and arrangement of layers shown in FIG. 2 are provided as an example. In practice, the VCSEL may include additional layers, fewer layers, different layers, or differently arranged layers than those shown in FIG. 2.

Figure 3:
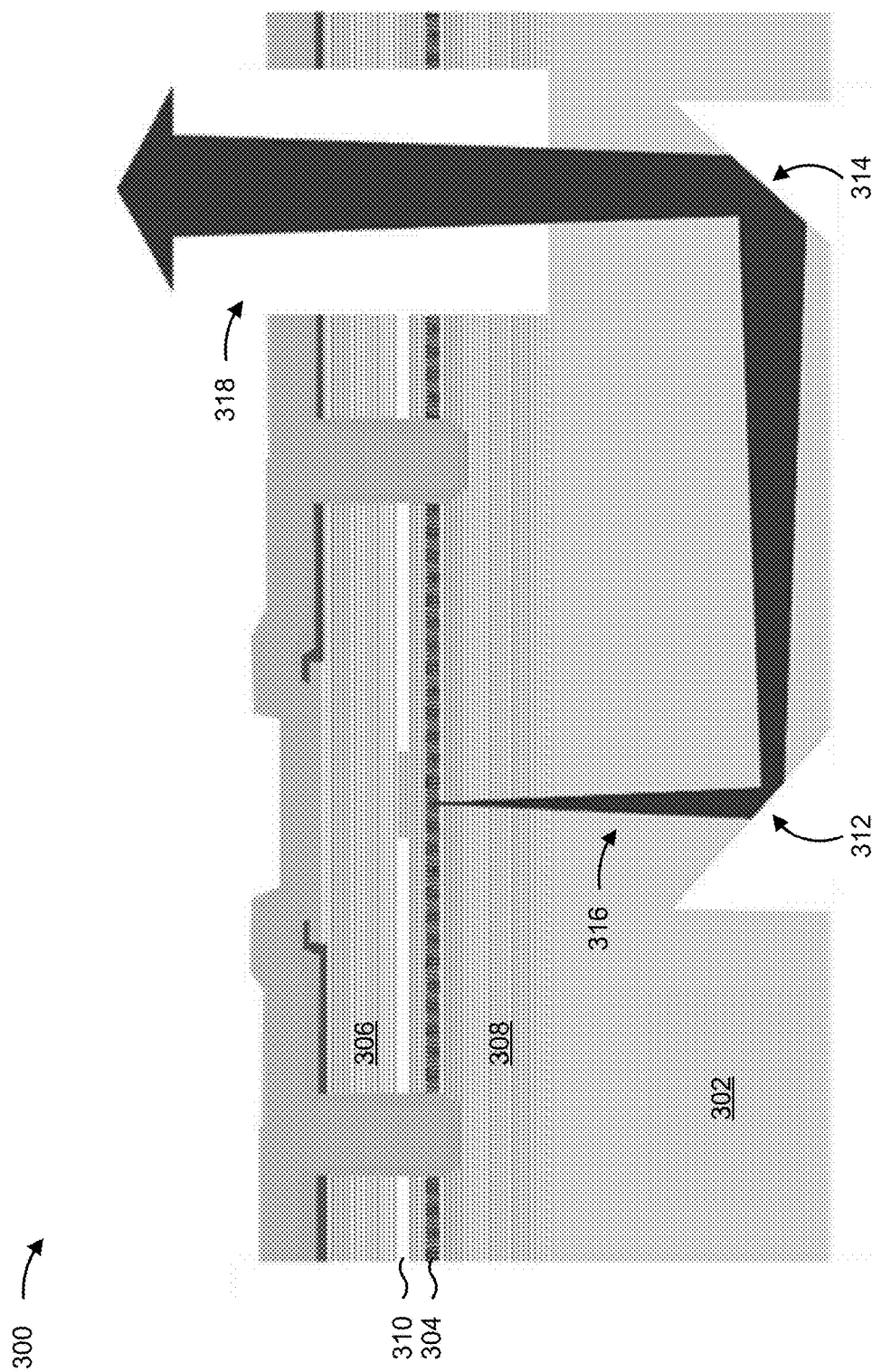

FIG. 3 is a diagram of a side view of a cross-section of an example implementation 300 of a VCSEL described herein. As shown in FIG. 3, the VCSEL may include a substrate layer 302, an active layer 304, a first mirror 306, a second mirror 308, an oxidation layer 310, a first angled reflector 312, a second angled reflector 314, and an exit window 318 (e.g., for an optical beam 316).

In some implementations, the substrate layer 302, the active layer 304, the first mirror 306, the second mirror 308, the oxidation layer 310, the first angled reflector 312, and/or the second angled reflector 314 may be respectively similar to the substrate layer 102, the active layer 104, the first mirror 106, the second mirror 108, the oxidation layer 110, the first angled reflector 112, and/or the second angled reflector 114 shown in and described herein with respect to FIG. 1. For example, the active layer 304, the first mirror 306, the second mirror 308, and/or the oxidation layer 310 may be epitaxial layers (e.g., grown on substrate layer 302).

In some implementations, at least one of the epitaxial layers may be etched away (e.g., using an RIE technique, an IBE technique, an argon sputtering technique, and/or the like) to form the exit window 318. For example, and as shown in FIG. 3, the active layer 304, the first mirror 306, the second mirror 308, and the oxidation layer 310 may be etched away to form the exit window 318. In some implementations, etching away one or more of the epitaxial layers may reduce and/or eliminate back reflection and/or absorption of the optical beam 316.

In some implementations, when the exit window 318 does not include one or more of the epitaxial layers, the VCSEL may include a greater amount (e.g., a greater thickness) of the first mirror 306 and/or the second mirror 308 in a region above and/or below the oxidation layer 310 than an amount of the first mirror and/or the second mirror included in a VCSEL that does include all of the epitaxial layers in the exit window (e.g., because back reflection and/or absorption of the optical beam 316 may be reduced and/or eliminated). In some implementations, including a greater amount of the first mirror 306 and/or the second mirror 308 in a region above and/or below the oxidation layer 310 may improve performance of the VCSEL as compared to a VCSEL including a smaller amount of the first mirror and/or the second mirror.

In some implementations, the VCSEL may include a custom DBR in the exit window 318. For example, the VCSEL may include a custom DBR configured to select a mode of the optical beam 316 to feed back to the active layer 304. In some implementations, the VCSEL may include a SiNx/SiOx/SiNx dielectric DBR deposited in the exit window 318 and configured to achieve an amount of reflection of the optical beam 316.

As indicated above, FIG. 3 is provided as an example. Other examples may differ from what is described with regard to FIG. 3. For example, in some implementations, the first angled reflector 312 and/or the second angled reflector 314 may be formed in molded optics, rather than the substrate layer 302, in a manner similar to that described with respect to FIG. 2. Additionally, or alternatively, the number and arrangement of layers shown in FIG. 3 are provided as an example. In practice, the VCSEL may include additional layers, fewer layers, different layers, or differently arranged layers than those shown in FIG. 3.

Figure 4:
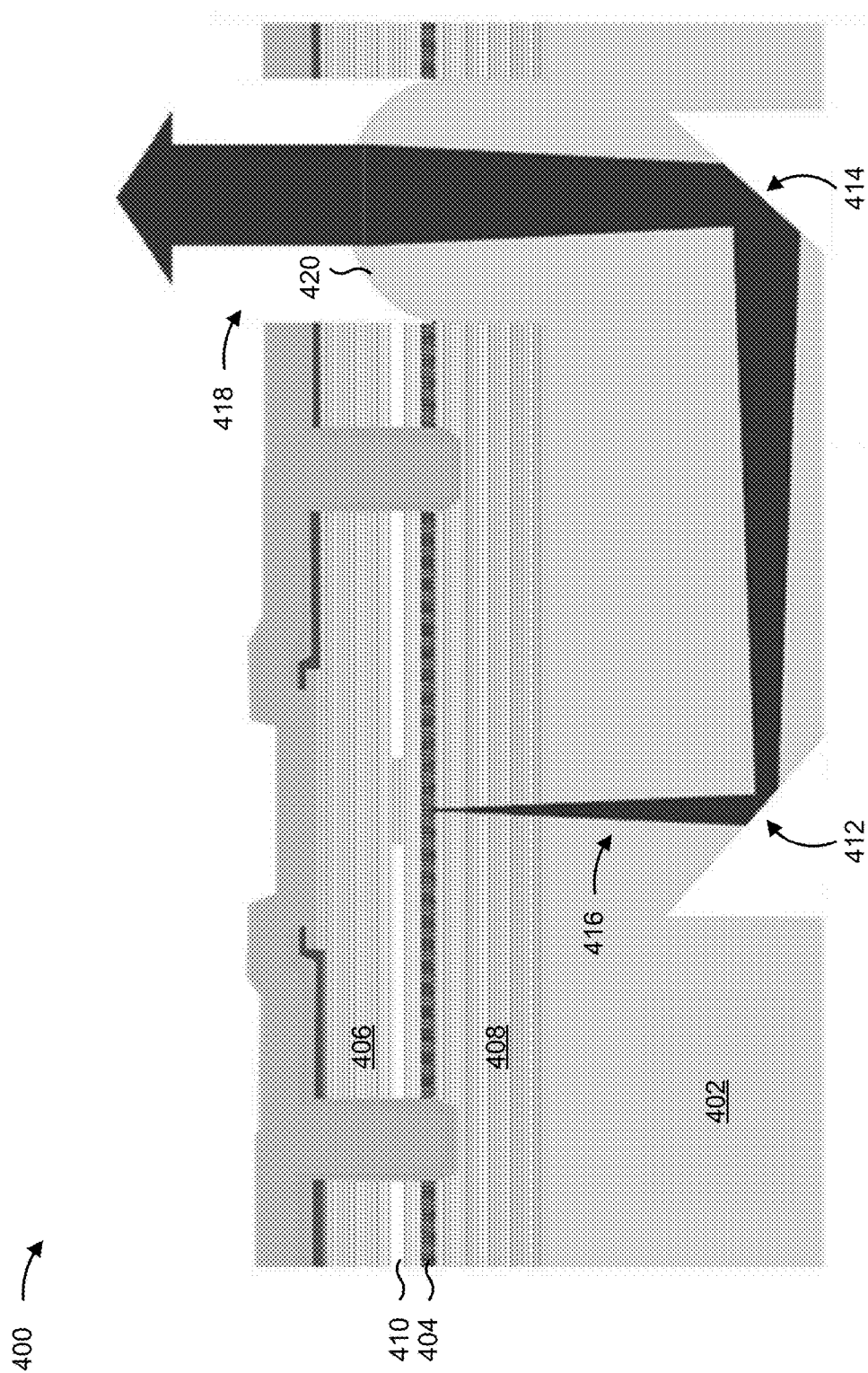

FIG. 4 is a diagram of a side view of a cross-section of an example implementation 400 of a VCSEL described herein. As shown in FIG. 4, the VCSEL may include a substrate layer 402, an active layer 404, a first mirror 406, a second mirror 408, an oxidation layer 410, a first angled reflector 412, a second angled reflector 414, an exit window 418 (e.g., for an optical beam 416), and an integrated lens 420.

In some implementations, the substrate layer 402, the active layer 404, the first mirror 406, the second mirror 408, the oxidation layer 410, the first angled reflector 412, and/or the second angled reflector 414 may be respectively similar to the substrate layer 102, the active layer 104, the first mirror 106, the second mirror 108, the oxidation layer 110, the first angled reflector 112, and/or the second angled reflector 114 shown in and described herein with respect to FIG. 1. For example, the active layer 404, the first mirror 406, the second mirror 408, and/or the oxidation layer 410 may be epitaxial layers (e.g., grown on substrate layer 402).

As shown in FIG. 4, the exit window 418 may include the integrated lens 420. In some implementations, the integrated lens 420 may be etched, deposited, molded, and/or the like. For example, one or more of the epitaxial layers may be etched away (e.g., using an RIE technique, an IBE technique, an argon sputtering technique, and/or the like) to form the integrated lens 420. In some implementations, the integrated lens 420 may be configured to collimate, focus, expand, contract, and/or the like the optical beam 416.

In some implementations, the integrated lens 420 may be provided on a top surface of the VCSEL, rather than in the exit window 418. For example, the integrated lens 420 may be positioned to receive the optical beam 416 after the optical beam 416 passes through the exit window 418.

As described above, the optical beam 416 may expand as it travels through the VCSEL (e.g., the substrate layer 402). In some implementations, the expansion of the optical beam 416 while traveling extra distance from the active layer 404, through the substrate 402, and to the exit window 418 may improve effectiveness of a lens element (e.g., the integrated lens 420 when positioned in the exit window 418, the integrated lens 420 when positioned on the top surface of the VCSEL, and/or the like). For example, the optical beam 416 may expand and fill the lens element.

As indicated above, FIG. 4 is provided as an example. Other examples may differ from what is described with regard to FIG. 4. For example, in some implementations, the first angled reflector 412 and/or the second angled reflector 414 may be formed in molded optics, rather than the substrate layer 402, in a manner similar to that described with respect to FIG. 2. Additionally, or alternatively, the number and arrangement of layers shown in FIG. 4 are provided as an example. In practice, the VCSEL may include additional layers, fewer layers, different layers, or differently arranged layers than those shown in FIG. 4.

Figure 5:
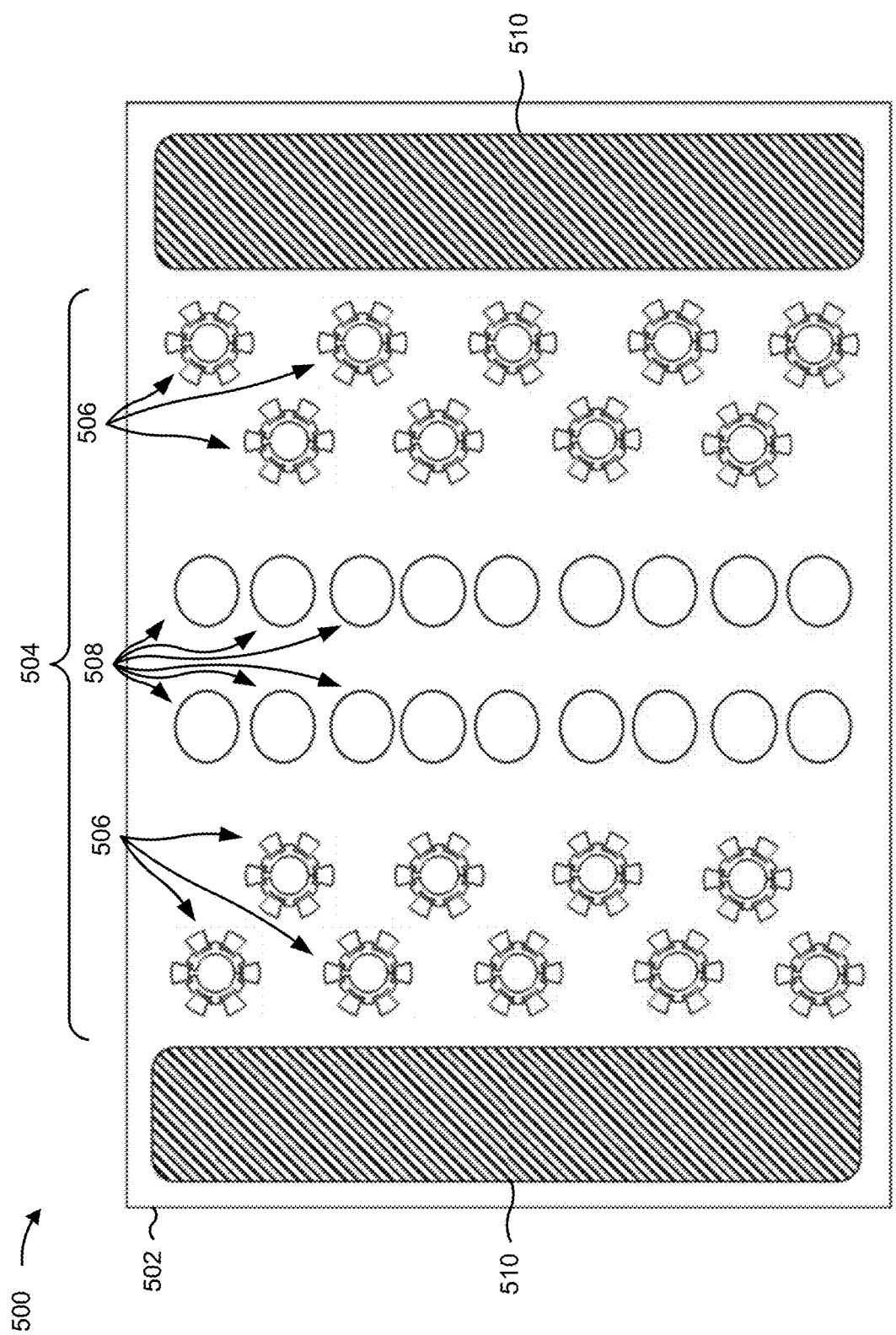
FIG. 5 is a diagram of a top view of an example implementation of an optical device including a chip and an array of VCSEL devices described herein.

FIG. 5 is a diagram of a top view of an example implementation 500 of an optical device including a chip 502 and an array of VCSEL devices 504 described herein. As shown in FIG. 5, the array of VCSEL devices 504 may be positioned on the chip 502. In some implementations, the VCSEL devices 504 may be similar to the example implementations 100, 200, 300, and 400 shown in and described with respect to FIGS. 1-4. For example, the VCSEL devices 504 may be top-emitting VCSELs having bottom-emitting structures.

As shown in FIG. 5, the VCSEL devices 504 may include emitting regions 506 (e.g., emitters) and exit windows 508 on a top surface of the chip 502. In some implementations, each VCSEL device, of VCSEL devices 504, may include an emitting region, of emitting regions 506, and an exit window, of exit windows 508. The emitting regions 506 may be configured to emit optical beams toward a bottom surface of the chip 502. For example, each of the emitting regions 506 may include an active layer, a first mirror, a second mirror, and an oxidation layer forming an optical aperture in a manner similar to that described with respect to FIGS. 1-4.

In some implementations, the VCSEL devices 504 may include angled reflectors (e.g., similar to the angled reflectors shown in and described herein with respect to FIGS. 1-4). For example, each VCSEL device, of the VCSEL devices 504, may include a pair of angled reflectors. For a VCSEL device, of the VCSEL devices 504, the angled reflectors may be configured to receive an optical beam from an emitting region and redirect the optical beam through an exit window.

In some implementations, the angled reflectors may be formed in molded optics (e.g., in a manner similar to the angled reflectors described herein with respect to FIG. 2). For example, the molded optics may include the angled reflectors for one or more of the VCSEL devices 504 (e.g., all of the VCSEL devices 504), and the molded optics may be positioned and/or attached to the bottom surface of the chip 502.

As shown in FIG. 5, the emitting regions 506 may be positioned at a periphery of the chip 502, and the exit windows 508 may be positioned toward a center of the chip 502. For example, for each VCSEL device, of the VCSEL devices 504, the emitting region may be positioned at the periphery of the chip 502, and the exit window may be positioned toward the center of the chip 502. By positioning the emitting regions 506 at the periphery of the chip 502, the emitting regions 506 may have a lower temperature (e.g., due to better heatsinking) as compared to emitting regions positioned toward a center of a chip.

In some implementations, an integrated lens may be positioned on the top surface of the chip 502 (e.g., over the exit windows 508). For example, the integrated lens may collimate, focus, expand, contract, and/or the like optical beams redirected by the angled reflectors through the exit windows 508.

As shown in FIG. 5, the optical device may include one or more bond pad areas 510, on the top surface of the chip 502. For example, the bond pad areas 510 (e.g., formed of metal) may connect to one or more of the VCSEL devices 504. In some implementations, the bond pad areas 510 may be connected (e.g., shorted and/or the like) to all of the VCSEL devices 504. Additionally, or alternatively, the bond pad areas 510 may be individually connected to each of the VCSEL devices 504 (e.g., to provide individual addressability).

As indicated above, FIG. 5 is provided as an example. Other examples may differ from what is described with regard to FIG. 5.

Figure 6:
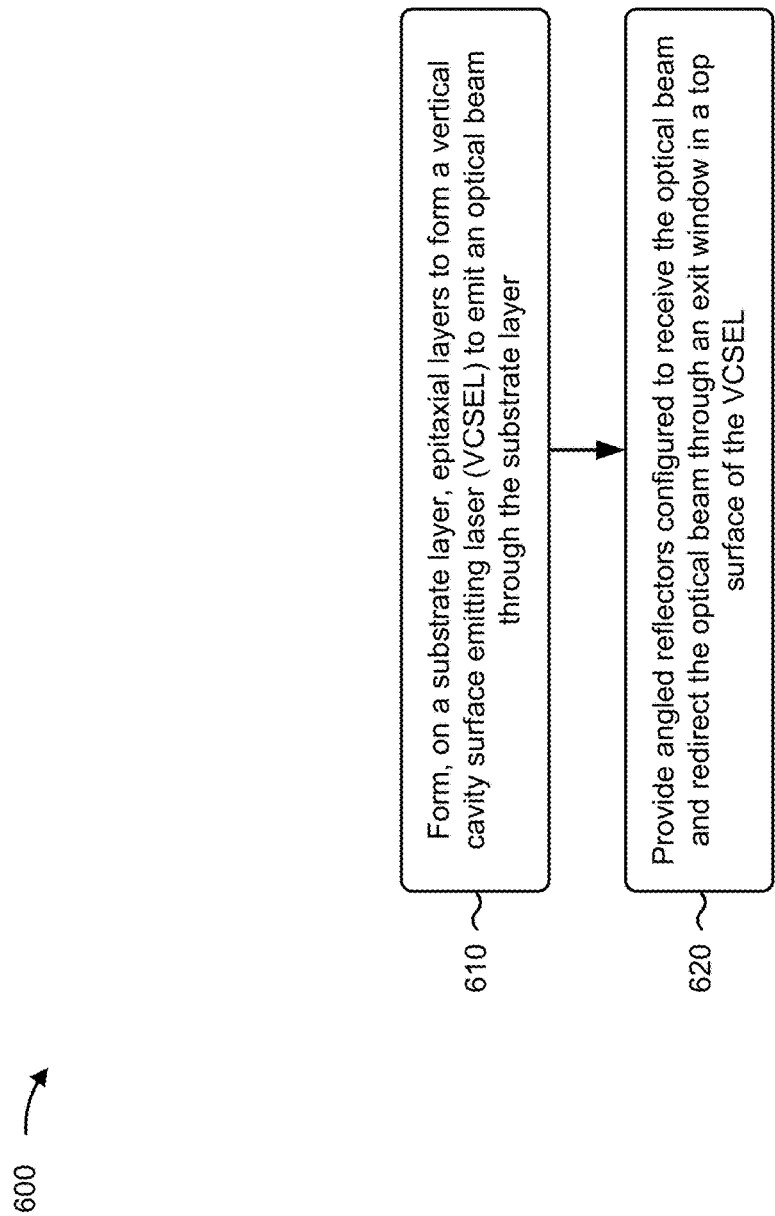
FIG. 6 is a flow chart of an example process associated with fabricating a VCSEL.

FIG. 6 is a flow chart of an example process 600 associated with fabricating a VCSEL. As shown in FIG. 6, process 600 may include forming, on a substrate layer, epitaxial layers to form a VCSEL to emit an optical beam through the substrate layer (block 610). For example, the epitaxial layers (e.g., an active layer, a first mirror, a second mirror, an oxidation layer, and/or the like) may be grown on the substrate layer to form a VCSEL to emit an optical beam through the substrate layer.

As further shown in FIG. 6, process 600 may include providing angled reflectors configured to receive the optical beam and redirect the optical beam through an exit window in a top surface of the VCSEL (block 620). For example, the angled reflectors may be configured to receive the optical beam and redirect the optical beam through an exit window in a top surface of the VCSEL, as described above.

Process 600 may include additional implementations, such as any single implementation or any combination of implementations described below and/or in connection with one or more other processes described elsewhere herein.

In a first implementation, providing the angled reflectors comprises etching the substrate layer to form the angled reflectors in the substrate layer.

In a second implementation, alone or in combination with the first implementation, etching the substrate layer to form the angled reflectors comprises etching the substrate layer using at least one of: a reactive ion etch technique, an ion beam etching technique, or an argon sputtering technique.

In a third implementation, alone or in combination with one or more of the first and second implementations, providing the angled reflectors comprises creating the angled reflectors during device fabrication on a substrate side of a wafer.

In a fourth implementation, alone or in combination with one or more of the first through third implementations, providing the angled reflectors comprises creating the angled reflectors, in the substrate layer, using one or more lithography steps.

In a fifth implementation, alone or in combination with one or more of the first through fourth implementations, providing the angled reflectors comprises attaching, to the substrate layer, molded optics including the angled reflectors.

Although FIG. 6 shows example blocks of process 600, in some implementations, process 600 may include additional blocks, fewer blocks, different blocks, or differently arranged blocks than those depicted in FIG. 6. Additionally, or alternatively, two or more of the blocks of process 600 may be performed in parallel.

In some implementations, a method may include generating (or forming) an array of light spots for three-dimensional sensing with a first set of emitters (e.g., VCSELs, VCSEL devices, and/or the like) and a second set of emitters (e.g., VCSELs, VCSEL devices, and/or the like). The second set of emitters may be randomly interleaved with the first set of emitters. The second set of emitters may have less optical power than the first set of emitters.

In some implementations, a method may include generating (or forming), a light pattern for three-dimensional sensing, wherein the light pattern comprises a first set of light spots and a second set of light spots. The second set of light spots may be randomly interleaved with the first set of light spots. The second set of light spots may have less optical power than the first set of light spots.

The foregoing disclosure provides illustration and description, but is not intended to be exhaustive or to limit the implementations to the precise form disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, a combination of related and unrelated items, etc.), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "above," "upper," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. An optical device, comprising:
a top surface;
a bottom surface;
a first angled reflector formed in the bottom surface;
a second angled reflector formed in the bottom surface at an angle relative to the first angled reflector,
wherein the first angled reflector is configured to receive an optical beam emitted toward the bottom surface and redirect the optical beam toward the second angled reflector, and
wherein the second angled reflector is configured to redirect the optical beam through an exit window in the top surface; and
a plurality of epitaxial layers,
wherein at least one of the plurality of epitaxial layers is etched away to form the exit window.

2. The optical device of claim 1, further comprising a substrate layer that defines the bottom surface,
wherein the substrate layer includes the first angled reflector and the second angled reflector.

3. The optical device of claim 1, further comprising molded optics that define the bottom surface,
wherein the molded optics include the first angled reflector and the second angled reflector.

4. The optical device of claim 3, wherein the molded optics include at least one optical element to modify the optical beam.

5. The optical device of claim 1, further comprising a distributed Bragg reflector (DBR) in the exit window.

6. The optical device of claim 1, wherein the exit window includes an integrated lens.

7. The optical device of claim 1, wherein the plurality of epitaxial layers include an active layer, a first mirror, a second mirror, and an oxidation layer.

8. An optical device, comprising:
a chip having a top surface and a bottom surface;
an emitting region positioned at a periphery of the chip and configured to emit an optical beam toward the bottom surface;
an exit window in the top surface that is positioned toward a center of the chip;
a first angled reflector formed in the bottom surface; and
a second angled reflector formed in the bottom surface at an angle relative to the first angled reflector,
wherein the first angled reflector is configured to receive the optical beam from the emitting region and redirect the optical beam toward the second angled reflector, and
wherein the second angled reflector is configured to redirect the optical beam through the exit window.

9. The optical device of claim 8, wherein the emitting region includes an active layer, a first mirror, a second mirror, and an oxidation layer.

10. The optical device of claim 8, further comprising molded optics that define the bottom surface of the chip,
wherein the molded optics include the first angled reflector and the second angled reflector.

11. The optical device of claim 8, further comprising a distributed Bragg reflector (DBR) in the exit window,
wherein the DBR is configured to select a mode of the optical beam to feed back to an active layer of the emitting region.

12. The optical device of claim 8, further comprising an additional emitting region configured to emit an optical beam toward the bottom surface.

13. The optical device of claim 8, further comprising an additional exit window in the top surface.

14. The optical device of claim 8, further comprising a plurality of epitaxial layers, wherein at least one of the plurality of epitaxial layers is etched away to form the exit window.

15. A method, comprising:

forming, on a chip, an emitting region configured to emit an optical beam toward a bottom surface of the chip;

forming, on a top surface of the chip, an exit window; and etching a substrate layer on the bottom surface of the chip to form a first angled reflector and a second angled reflector in the substrate layer, wherein the first angled reflector is angled relative to the second angled reflector and is configured to receive the optical beam and redirect the optical beam toward the second angled reflector, and wherein the second angled reflector is configured to redirect the optical beam through the exit window.

16. The method of claim 15, wherein etching the substrate layer on the bottom surface of the chip comprises etching the substrate layer on the bottom surface of the chip using at least one of:

a reactive ion etch technique, an ion beam etching technique, or an argon sputtering technique.

17. The method of claim 15, further comprising forming, on the chip, an additional emitting region configured to emit an optical beam toward the bottom surface of the chip.

18. The method of claim 15, further comprising forming, on the top surface of the chip, an additional exit window.

19. The method of claim 15, wherein forming the exit window comprises etching away at least one epitaxial layer, of a plurality of epitaxial layers.

20. The method of claim 19, wherein the plurality of epitaxial layers include an active layer, a first mirror, a second mirror, and an oxidation layer.

* * * * *